(12) United States Patent
Chang et al.

(10) Patent No.: US 12,527,006 B2
(45) Date of Patent: Jan. 13, 2026

(54) VERTICAL 1T1R STRUCTURE FOR EMBEDDED MEMORY

(71) Applicant: Taiwan Semiconductor Manufacturing Company, Ltd., Hsinchu (TW)

(72) Inventors: Kuo-Pin Chang, Zhubei (TW); Yu-Wei Ting, Taipei (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 883 days.

(21) Appl. No.: 17/701,144

(22) Filed: Mar. 22, 2022

(65) Prior Publication Data

US 2023/0309325 A1    Sep. 28, 2023

(51) Int. Cl.
*H10B 63/00*    (2023.01)
*H01L 23/528*   (2006.01)
*H10N 70/00*    (2023.01)

(52) U.S. Cl.
CPC ......... *H10B 63/84* (2023.02); *H01L 23/5283* (2013.01); *H10B 63/30* (2023.02); *H10N 70/011* (2023.02); *H10N 70/826* (2023.02)

(58) Field of Classification Search
CPC .. H10B 63/84; H01L 23/5283; H10N 70/011; H10N 70/826
See application file for complete search history.

(56) References Cited

U.S. PATENT DOCUMENTS

| | | | |
|---|---|---|---|
| 6,879,505 B2 | 4/2005 | Scheuerlein | |
| 8,338,224 B2 | 12/2012 | Yoon et al. | |
| 2020/0144330 A1 | 5/2020 | Majhi et al. | |
| 2021/0308117 A1 | 10/2021 | Kumar et al. | |
| 2021/0366544 A1 | 11/2021 | Harari | |
| 2021/0399052 A1 | 12/2021 | Wu et al. | |

*Primary Examiner* — Marvin Payen
(74) *Attorney, Agent, or Firm* — Eschweiler & Potashnik, LLC

(57) ABSTRACT

Some embodiments relate to an embedded memory device with vertically stacked source, drain and gate connections. The semiconductor memory device includes a substrate and a pillar of channel material extending in a first direction. A bit line is disposed over the pillar of channel material and is coupled to the pillar of channel material, and extends in a second direction that is perpendicular to the first direction. Word lines are on opposite sides of the pillar of channel material and extend in a third direction. The third direction is perpendicular to the second direction. A dielectric layer separates the word lines from the pillar of channel material. Source lines extend in the third direction over the substrate, directly beneath the word lines. Variable resistance memory layers are between the source lines and an outer sidewall of the dielectric layer, laterally surrounding the sidewalls of the pillar of channel material.

20 Claims, 13 Drawing Sheets

VERTICAL 1T1R STRUCTURE FOR EMBEDDED MEMORY

BACKGROUND

Many modern day electronic devices contain embedded memory. Embedded memory is used in a variety of embedded systems in order to speed up response times and lower the profile of the device. Compared to current standalone memory, such as solid state drives, embedded memory typically is less power intensive and has a much smaller profile. Embedded memory typically utilizes a transistor as a selector. This is done in order to limit leakage current and prohibit program disturb errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
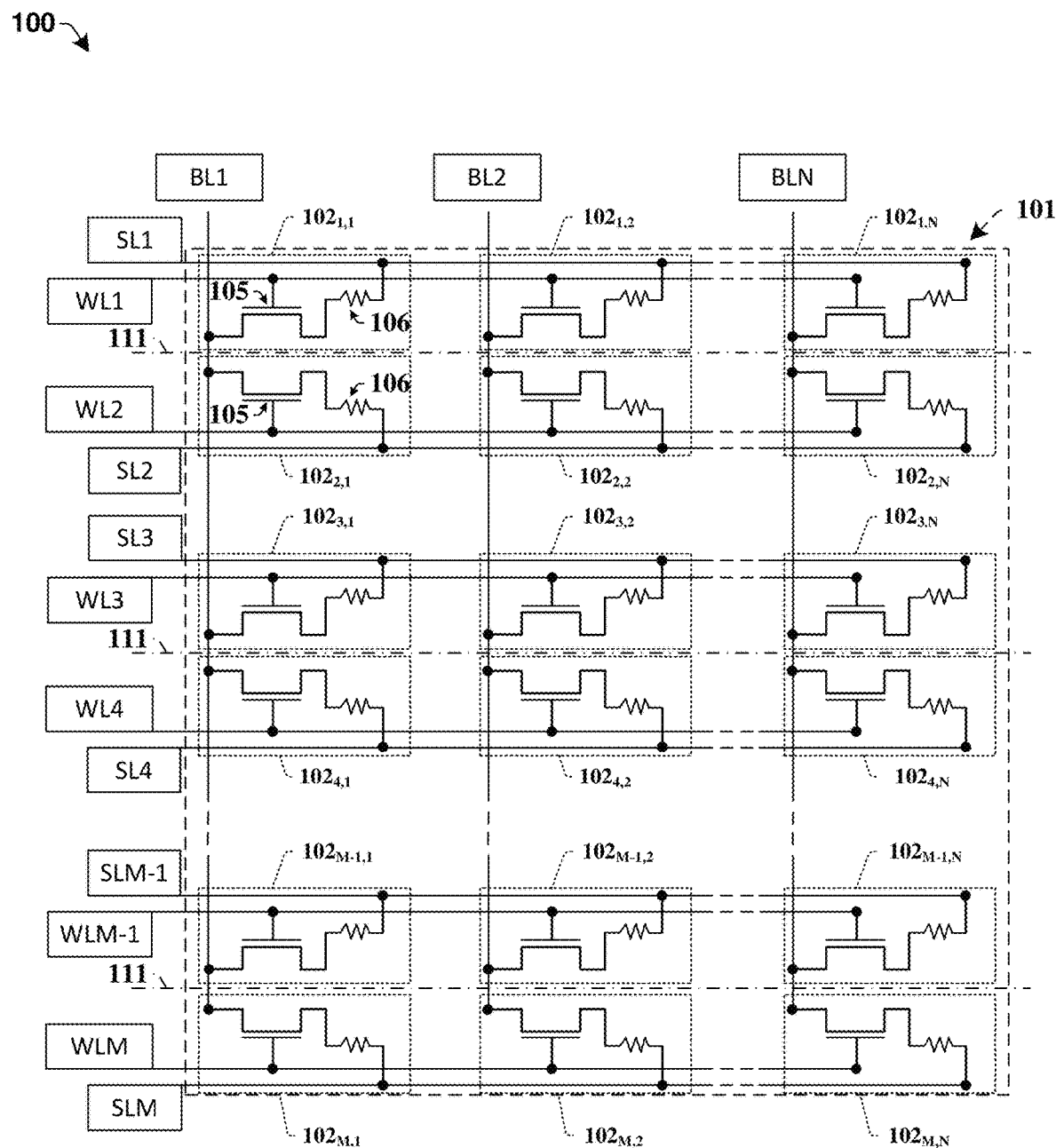
FIG. 1 illustrates a block diagram of an embedded memory device according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An embedded memory cell includes an access transistor and a memory element. In conventional memory cells, the access transistor is formed in a front end of line process with its components spread over a horizontal area. As an access transistor is included for every cell in order to stop program disturb errors and leakage currents, the relatively large area of the conventional design limits how densely packed the embedded memory array can be, lowering the efficiency of the chip as well as raising product costs. Conventional designs also may utilize an etching process to define the boundaries of the memory devices, which may cause damage to the surfaces or corners of a memory device, decreasing reliability. To increase the efficiency and the cell density of an embedded memory array, and to enhance the reliability of each memory cell, the present disclosure provides for techniques to create a vertically stacked access transistor with a much smaller profile than conventional designs.

Memory devices typically include an array of memory cells arranged in rows and columns. FIG. 1 shows an example of an embedded memory device 100 that includes an array 101 in which a plurality of memory cells 102 are arranged in a series of M columns and N rows, where M and N can be any integers and can be the same or different from one another. For clarity, the individual memory cells 102 are labeled as $102_{ROW\text{-}COLUMN}$ in FIG. 1. Each memory cell includes an access transistor 105 and a variable resistance element 106, but these elements have only been labeled with regards to cells $102_{1\text{-}1}$ and $102_{2\text{-}1}$ for ease of viewing. Each variable resistance element 106 has a variable resistance that can be set such that the resistance of each variable resistance element corresponds to a digital data state stored in that memory cell. Thus, the array 101 can store a large number of bits of digital data corresponding to the number of memory cells in the array.

In FIG. 1's example, word lines (WLs) and source lines (SLs) extend along corresponding rows of the array 101, and bit lines (BL) extend along corresponding columns of the array 101. More particularly, a word line for a given row is coupled to gates of the access transistors 105 along the row, and the bit line for each row is coupled to drains of the access transistors 105 for the column. For example, the first memory cell $102_{1,1}$ and the second memory cell $102_{2,1}$ each have a drain of their respective access transistors 105 coupled to a first bit line BL1, while the access transistor 105 of the first memory cell $102_{1,1}$ has a gate coupled to a first word line WL1 and access transistor 105 of the second memory cell $102_{2,1}$ has a gate coupled to a second word line WL2. Each variable resistance memory element 106 has a first end coupled to the source of the access transistor 105 of its memory cell, and a second end coupled to the source line corresponding to the row in which the memory cell is arranged. As will be appreciated, this general arrangement be implemented in ways that provide a much denser layout than conventional designs. For example, the memory cells may be grouped into subsets or pairs arranged between neighboring word lines, wherein these subsets or pairs are generally mirror-images of one another about a central axis 111 between the neighboring word lines. For example, the first and second memory cells $102_{1,1}$ and $102_{2,1}$ can be mirror images of one another about a central axis or plane 111 between the first and second word lines WL1, WL2.

Figure 2:
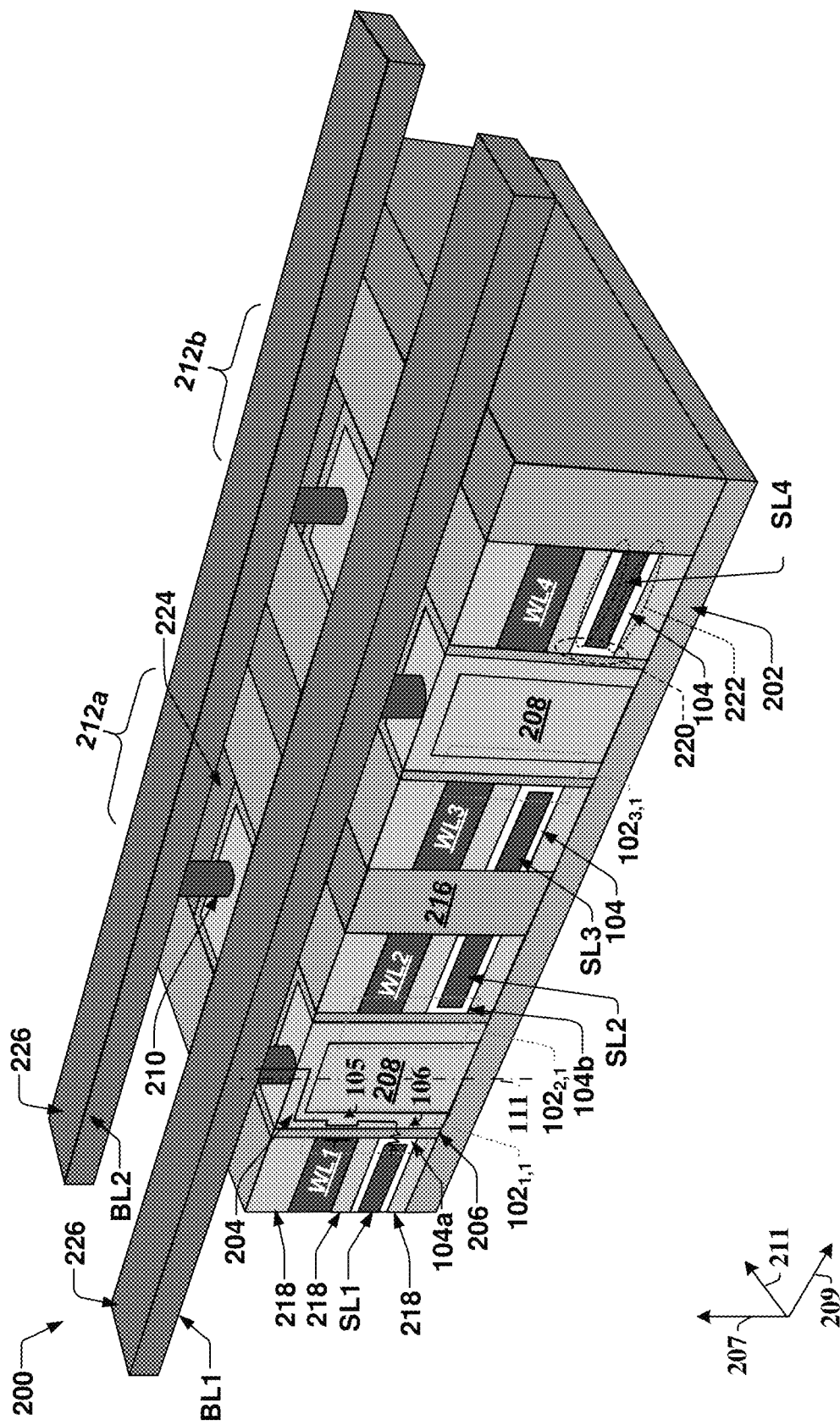
FIG. 2 illustrates a three-dimensional view of some embodiments of an embedded memory device including resistive cells.

FIG. 2 illustrates a three-dimensional view of some embodiments of an embedded memory array 200, which is generally consistent with FIG. 1 and which exhibits a dense layout. The embedded memory array 200 includes a substrate 202, such as a monocrystalline substrate or silicon or insulator (SOI) substrate. Pillars of channel material 204 extend upward from the substrate 202 in a first direction 207 that is substantially perpendicular to an upper surface of the substrate 202. Bit lines 226, which are coupled to the pillars of channel material 204, are disposed over the pillars of channel material 204 and extend in a second direction 209 that is parallel to the upper surface of the substrate and perpendicular to the first direction 207. A dielectric layer 206 laterally surrounds sidewalls of the pillars of channel material 204. Word lines (e.g., WL1-WL4) are disposed at a first height on opposite sides of pillars of channel material 204 and extend in a third direction 211 over the substrate 202, wherein the third direction 211 is perpendicular to the second direction 209. For example, first and second word lines WL1, WL2 are disposed on opposite sides of a pillar of channel material 204 and are separated from the pillar by the dielectric layer 206. Source lines (e.g., SL1-SL4) extend in the third direction 211 over the substrate 202 and are disposed directly beneath the word lines. For example, first and second source lines (SL1, SL2) are disposed directly beneath the first and second word lines (WL1, WL2), respectively. A variable resistance memory layer 104 is disposed between the source lines and an outer sidewall of the dielectric layer 206 that laterally surrounds the sidewalls of the pillar of channel material 204. For example, a first variable resistance memory layer 104$a$ is arranged between the first source line SL1 and the leftmost pillar of channel material 204, and a second variable resistance memory layer 104$b$ is arranged between the second source line SL2 and the leftmost pillar of channel material 204. Thus, each pillar of channel material corresponds to two memory cells—one memory cell on each side of the pillar. For instance, for the leftmost illustrated pillar, a first memory cell $102_{1,1}$ is disposed on the left side of the pillar and a second memory cell $102_{2,1}$ is disposed on the right side of the pillar. Consistent with FIG. 1, each of these memory cells includes an access transistor 105 and a variable resistance element 106 to provide a dense layout.

The substrate 202 may be, for example, a bulk substrate (e.g., a bulk silicon substrate) or a silicon-on-insulator (SOI) substrate, among others. The dielectric layers 206 comprise oxide-based materials, nitride-based materials, high-k materials, or other suitable materials.

The pillars of channel material 204 are depicted as square columns in FIG. 2, but in other embodiments they are cylindrical. The pillars of channel material 204 may comprise indium gallium zinc oxide (IGZO), a lightly doped polysilicon (in some embodiments with a concentration of $1E15/cm^3$ to $1E17/cm^3$, though other ranges of values are also within the scope of this disclosure), or undoped polysilicon. Between inner sidewalls of the pillars of channel material 204 are insulating cores 208. The insulating cores 208 may comprise silicon oxide or other suitable materials. The insulating cores are also cylindrical or pillar-shaped and separate the first memory cell $102_{1,1}$ from the second memory cell $102_{1,1}$, to improve the performance of the pair of memory cells through limiting the thickness of the sidewalls of the pillars of channel material 204 in order to limit the interaction between the first memory cell and the second memory cell.

The bit line contacts 210 are cylindrical and share central axes 111 with the pillars of channel material 204 and insulating cores 208. The bit line contacts 210 are disposed entirely above the dielectric layers 206, and extend in the first direction 207 directly above the insulating cores 208. In some embodiments, the bit line contacts comprise a conductive material such as doped polysilicon or a metal, such as copper.

The pillars of channel material 204 are disposed on the substrate in columns of pillars of channel material 212. These columns of pillars of channel material 212 correspond to the rows of the array 101 of FIG. 1. Each of the columns of pillars of channel material 212 is parallel to one another and extend in the third direction 211 that is perpendicular to the first direction 207 and the second direction 209. These columns are separated from one another by insulating segments 216. Each of these columns of pillars of channel material 212 are between word lines WL1, WL2, etc., source lines SL1, SL2, etc., and variable resistance memory layers 104A, 104B, etc. In some embodiments, the columns of pillars of channel material 212 are equidistant from adjacent columns of pillars of channel material 212. A series of oxide layers 218 are disposed directly above and below the source lines SL1, SL2 and the variable resistance memory layers 104A, 104B. The variable resistance memory layers 104A, 104B are respectively disposed between the source lines SL1, SL2 and an outer sidewall of the dielectric layer 206 that is laterally surrounding the sidewalls of the pillar of channel material. The variable resistance memory layers 104A, 104B further extend across top and bottom surfaces of the source lines SL1, SL2 until reaching the insulating segments 216. In other words, the source lines SL1, SL2 are directly between top surfaces and bottom surfaces of the variable resistance memory layers 104A, 104B.

In some embodiments, each pillar of channel material 204 of a first column of pillars of channel material has a width equal to each other pillar of channel material of the first column of pillars of channel material when measured in a second direction.

In some embodiments, the variable resistance memory layers 104A, 104B each have a base side 220 and two prongs 222. The base side 220 extends along the sidewalls of the pillar of channel material, while the two prongs 222 extend outward from the base side along a top and bottom surface of one of the source lines SL1, SL2, etc. In some embodiments, the variable resistance memory layers 104A, 104B are a ferroelectric tunnel junction (FTJ) comprising hafnium oxide ($HfO_2$), hafnium zirconium oxide (HZO), lead zirconium titanate ($Pb[Zr_xTi_{1-x}]O_3$), strontium bismuth tantalate ($Sr_2Bi_2TaO_9$), bismuth lanthanum titanate ($(Bi,La)_4Ti_3O_{12}$), or other suitable materials. In some embodiments, the variable resistance memory layers 104A, 104B are a resistive random access memory (ReRAM) comprising germanium antimony telluride (GeSbTe), silver indium antimony telluride (AgInSbTe), nickel oxide (NiO), titanium dioxide ($TiO_2$), strontium zirconate-titanate ($Sr[Ti_xZr_{1-x}]O_3$), PCMO (PrCaMnO), germanium sulfide (GeS), germanium selenide (GeSe), silicon oxide (SiOx), copper(i) sulfide $Cu_2S$, tantalum pentoxide $Ta_2O_5$ or other suitable materials. In some embodiments, the variable resistance memory layers 104A, 104B are a magnetoresistive random access memory (MRAM) comprising nickel iron alloy (NiFe), nickel iron cobalt alloy (NiFeCo), cobalt iron alloy (CoFe), cobalt platinum alloy (CoPt), cobalt chromium platinum alloy CoCrPt, aluminum oxide ($Al_2O_3$), silicon oxide (SiOx), FeNi, iron tantalum alloy (FeTa), iron tantalum chromium alloy (FeTaCr), iron aluminum alloy (FeAl), iron zirconium alloy (FeZr), nickel iron chromium alloy (NiFeCr), nickel iron alloy (NiFeX), or other suitable materials.

The word lines WL1, WL2 are disposed at a first height on opposite sides of a column of pillars of channel material 212 and extend in the third direction 211 211 over the substrate. The word lines WL1, WL2 are arrayed between the dielectric layer 206 and the insulating segments 216 in the second direction 209 directly above the variable resistance memory layers 104A, 104B. The word lines WL1, WL2 are or comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials. The dielectric layer 206 separates the word lines WL1, WL2 from the column of pillars of channel material. The source lines SL1, SL2, etc. also extend in the third direction 211 over the substrate 202, and are disposed directly beneath the word lines WL1, WL2, etc., respectively. The source lines are or comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials. The insulating segments 216 extend in the same direction as the columns of pillars of channel material 212, and separate the source lines SL1, SL2 and the word lines WL1, WL2 from other source lines SL3, SL4, etc., and word lines WL3, WL4, etc.

The pillars of channel material 204 within a column of pillars of channel material 212 are spaced by insulating structures 224 in the third direction 211. Insulating structures 224 extend between the pillars of channel material 204 of a column. The insulating structures 224 have flat surfaces in FIG. 2, but in other embodiments they have concave faces that wrap around the pillars of channel material 204. The insulating structures 224 have a top surface that is co-planar with top surfaces of the dielectric layer 206, the uppermost of the oxide layers 218, and the insulating segment 216.

The bit lines 226 are arranged over the bit line contacts 210. The bit lines 226 are parallel with one another and extend in the second direction 209. The bit lines are or comprise copper (Cu), aluminum (Al), gold (Au), silver (Ag), some other conductive material, or a combination of the foregoing.

The pillar of channel material 204 acts as a channel for the access transistor of each memory cell 102. With the word line WL1 functioning as a gate electrode, and the dielectric layer 206 preventing current leakage from the word line WL1 to the pillar of channel material 204, this combination of features acts as a gate structure on each side of the pillar of channel material 204. In order to operate a memory cell 102, a voltage is applied the word line WL1 to turn on the access transistor, and the bit line BL1 and source line SL1 are biased in order to either change or read the resistance of the variable resistance memory layer 104.

Advantageously, because source, drain and gate connections of the access transistors are vertically stacked, the overall area of each memory cell 102 on the substrate can be reduced relative to conventional approaches. Some conventional designs maintain a unit cell dimension of $25F^2$ (where F is the minimum feature size of the array 101), while the vertical layout in this disclosure lowers the possible unit cell dimension to $4F^2$. Compared to previous approaches, this reduced area makes the embedded memory array 101 more efficient, as greater amounts of information can be stored in the same amount of space, which is critical in a variety of sectors.

Figure 3A:
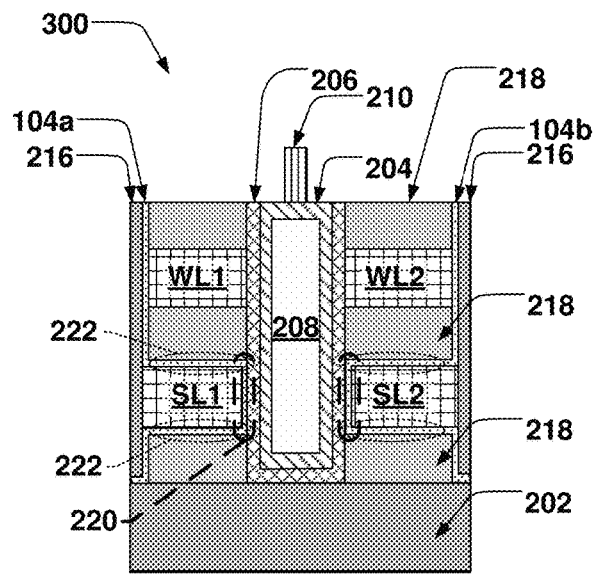
FIGS. 3A-3D illustrate a series of cross-sectional views of some embodiments of a pair of memory cells of FIG. 2's embedded memory device.

FIGS. 3A-3D show various cross-sectional views 300 of several different embodiments of a pair of memory cells 102. As shown in FIG. 3A, in some embodiments, variable resistance memory layers 104A, 104B extend past the source lines SL1, SL2, line sidewalls of the insulating segments 216, and separate the word lines WL1, WL2 from the insulating segments 216. In these embodiments, the variable resistance memory layers 104A, 104B separate the insulating segments 216 from the substrate and are connected to variable resistance memory layers R3, etc. of other columns by extending continuously under the insulating segments 216. In this case, the operation of the variable resistance memory layers 104A, 104B does not interfere with the other layers, as the biasing voltages used to alter the resistance of the variable resistance memory layers 104A, 104B only occur in the segments between the pillars of channel material and the source lines SL1, SL2. In other words, the resistance of the variable resistance memory layers 104A, 104B only varies in an active region localized between the pillar of channel material 204 and the word lines WL1, WL2.

In addition, FIG. 3A shows one possible configuration of the pillar of channel material 204, the dielectric layer 206, and the insulating core 208. In some embodiments, the dielectric layer 206 extends along a bottom surface of the pillar of channel material 204 and between the pillar of channel material 204 and the substrate 202. In this case, the pillar of channel material 204 covers a top surface, a bottom surface, and sidewalls of the insulating core 208.

Figure 3B:
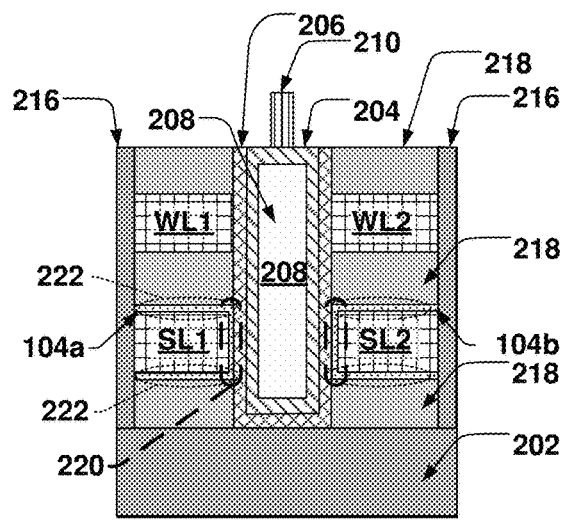

As shown in FIG. 3B, in some embodiments, the variable resistance memory layers 104A, 104B extend over and under the source lines SL1, SL2, ending at sidewalls of the insulating segments 216. In these embodiments, the segments of the variable resistance memory layers 104A, 104B are not connected to other variable resistance memory layers 104A, 104B because the variable resistance memory layers 104A, 104B, R3, etc. terminate at the edge of the insulating segment 216.

As will be appreciated, both of the embodiments of the variable resistance memory layer 104A, 104B shown in FIGS. 3A-3B provide spacing between the active region of the variable resistance memory layers 104A, 104B and any etching or removal processes that may damage them, due to the variable resistance memory layer 104 being formed after all etching steps except for those performed to shape the source lines SL1, SL2 and the insulating segments 216. The etching steps that shape the source lines SL1, SL2 only affect components that are separated from the active region of the variable resistance memory layers 104A, 104B by sections of the source lines SL1, SL2 vertically between segments of the variable resistance memory layers 104A, 104B.

Figure 3C:
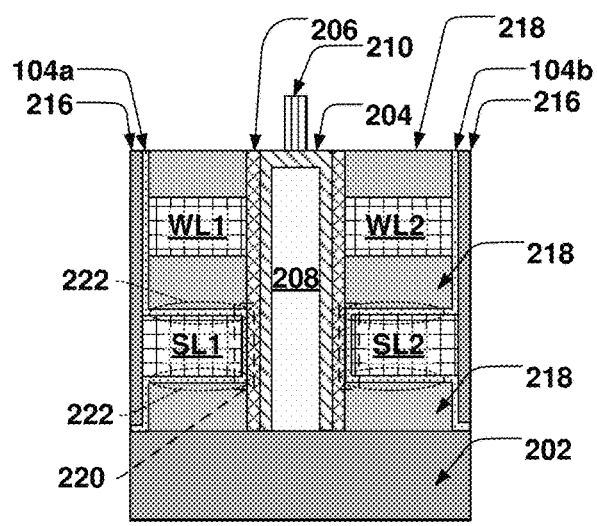

As shown in FIG. 3C, in some embodiments, the pillar of channel material 204, the dielectric layer 206, and the insulating core 208 each extend to the substrate 202. In this case, the dielectric layer 206 has a ring shape, with inner sidewalls and outer sidewalls of equal height. The insulating core 208 extends from the upper surface of the substrate 202 and is spaced from the dielectric layer by the pillar of channel material.

Figure 3D:
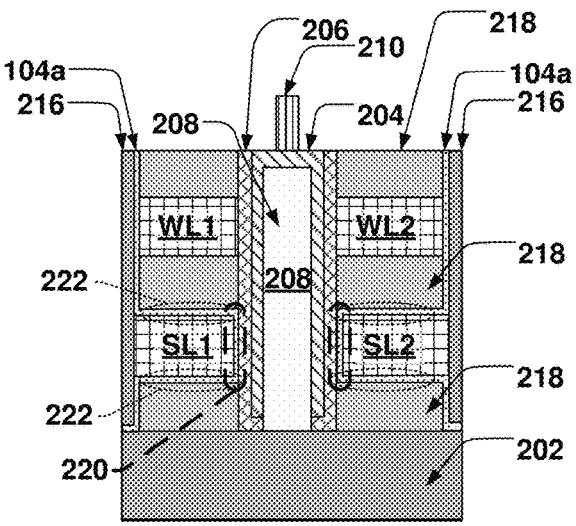

As shown in FIG. 3D, in some embodiments, the insulating core 208 extends to the substrate 202, and the dielectric layer 206 extends beneath the pillar of channel material 204 in the first direction 207. In this case, the dielectric layer is contacting sidewalls of the insulating core 208, and extends directly between the pillar of channel material 204 and the substrate 202.

In each of these embodiments, the pillar of channel material 204 covers the top surface of the insulating core 208. This provides a point of contact for the bit line contact 210 that is approximately halfway between the first and second memory cells $102_{1,1}$, $102_{2,1}$, notwithstanding small misalignments due to patterning and/or photolithography tolerances.

Figure 4A:
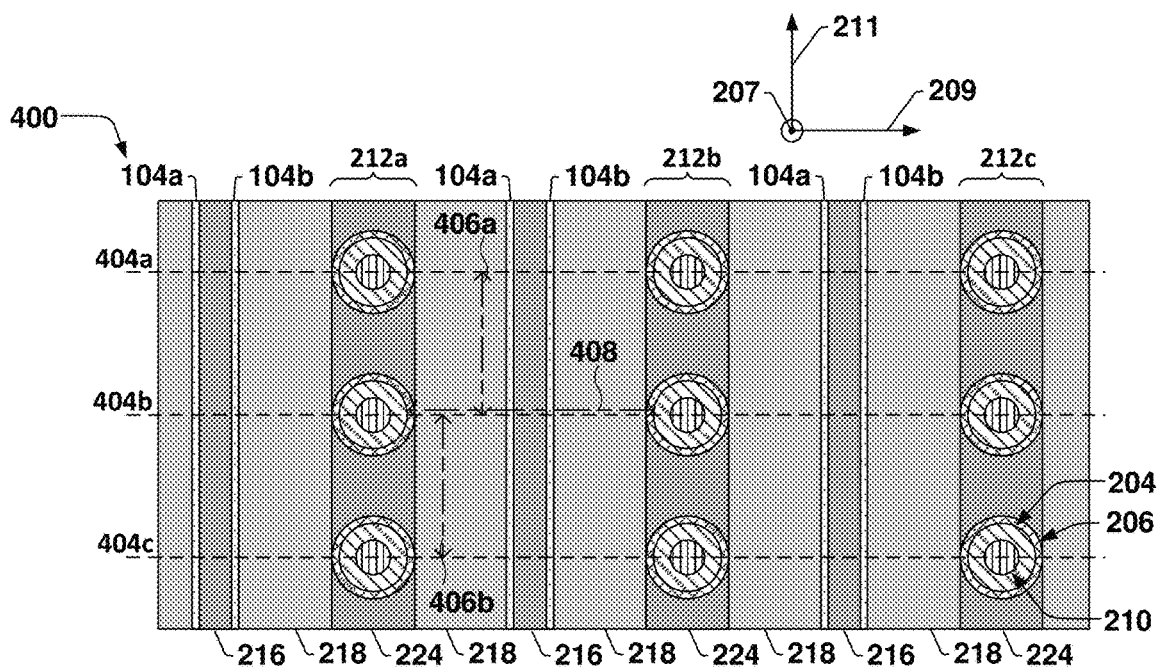
FIGS. 4A-4B illustrate a series of top views of FIG. 2's embedded memory device.
Figure 4B:
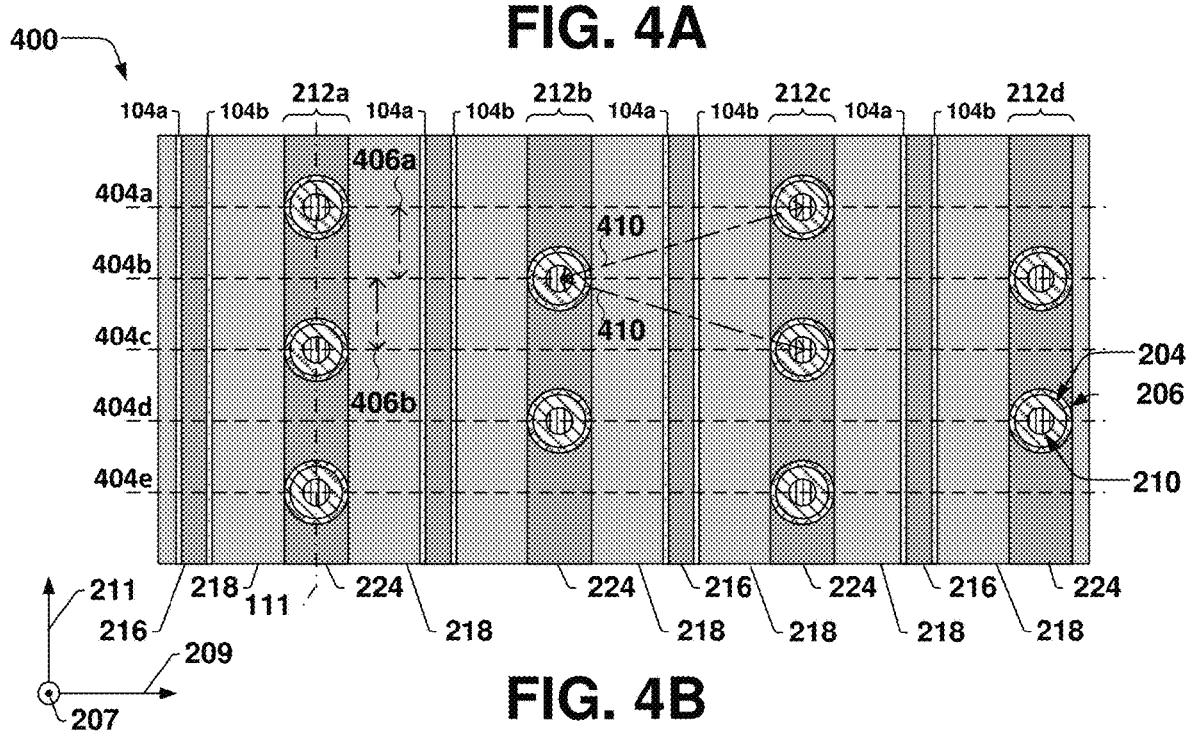

FIGS. 4A-4B illustrate top views 400 of some embodiments of an embedded memory device, which includes the first column of pillars of channel material 212a, the second column of pillars of channel material 212b, and a third column of pillars of channel material 212c. The bit lines BL1, BL2, etc. are not shown, though they follow horizontal lines 404 perpendicular to the columns of pillars of channel material 212. In some embodiments, the horizontal lines 404 are each parallel with one another and are equidistant from each adjacent horizontal line 404. The second horizontal line 404b is a first distance 406a from the first horizontal line 404a and a second distance 406b from the third horizontal line 404c. In some embodiments, the first distance 406a and the second distance 406b are equal. In some embodiments, the horizontal lines 404 extend solely in a second direction 209.

As shown in FIG. 4A, in some embodiments the pillars of channel material 204 are arranged in a first arrangement, in which a pillar of channel material 204 of each of the first column of pillars of channel material 212a, the second column of pillars of channel material 212b, and the third column of pillars of channel material 212c is centered on a first horizontal line 404a. The pillars of channel material 204 centered on the first horizontal line 404a are each adjacent to another pillar of channel material 204 of their respective column of pillars of channel material 212, which are each centered on a second horizontal line 404b parallel to the first horizontal line 404a. This pattern continues, where the first column of pillars of channel material 212a are aligned with the second column of pillars of channel material 212b and third column of pillars of channel material 212c on horizontal lines 404. In some embodiments, the horizontal lines 404 form a rectangular grid with the columns of pillars of channel material 212, with a pillar of channel material 204 at each crossing of the horizontal lines 404 and the column of pillars of channel material 212. In some embodiments, bit lines BL1, BL2 are coupled to a bit line contact 210 in each of the column of pillars of channel material 212. Bit lines BL1, BL2 are conductive wirings that extend along the horizontal axes 404 and electrically couple the each of the column of pillars of channel material 212.

In some embodiments, the first column of pillars of channel material 212a is aligned with the second column of pillars of channel material 212b such that a shortest line 408 drawn between any pillar of channel material of the first column of pillars of channel material 212a and a nearest pillar of channel material of the second column of pillars of channel material 212b is parallel to the second direction 209.

As shown in FIG. 4B, in some embodiments the pillars of channel material 204 are arranged in a second arrangement, in which the first column of pillars of channel material 212a and the third column of pillars of channel material 212c have pillars of channel material 204 that are centered on a first plurality of horizontal lines, while the pillars of channel material 204 in the second column of pillars of channel material 212b and the fourth column of pillars of channel material 212d are not centered on the first plurality of horizontal lines 404. In some embodiments, the pillars of channel material 204 of the second column of pillars of channel material 212b are centered on a second plurality of horizontal lines. The first plurality of horizontal lines comprise the first horizontal line 404a, the third horizontal line 404c, and subsequent odd-numbered horizontal lines 404e, etc. The second plurality of horizontal lines comprise the second horizontal line 404b, the fourth horizontal line 404d, and subsequent even-numbered horizontal lines 404f, etc. In this embodiment, a first bit line BL1 and a third bit line BL3, as well as subsequent odd-numbered bit lines BLS, etc., follow the first plurality of horizontal lines and are each coupled to a bit line contact in the first column of pillars of channel material 212a, the third column of pillars of channel material 212c, and subsequent odd-numbered columns of pillars of channel material. A second bit line BL2 and subsequent even-numbered bit lines BL4, etc., follow the second plurality of horizontal lines and are coupled to a bit line contact in the second column of pillars of channel material 212b, the fourth column of pillars of channel material 212d and subsequent even-numbered columns of pillars of channel material. In some embodiments, the alignment of the pillars of channel material 204 forms a repeating pattern across the embedded memory device, and the bit lines BL1, BL2, BL3, etc. will continue to couple to the bit line contacts of even or odd-numbered columns of pillars of channel material 212 across the embedded memory device.

In some embodiments, a pillar of channel material 204 from the first column of pillars of channel material 212a is a substantially equal distance 410 away from two pillars of channel material 204 of the second column of pillars of channel material 212b that are nearest to the pillar of channel material 204 from the first column of pillars of channel material 212a.

In addition to the benefits associated with the vertical stack of transistor components and the spacing of the resistive element from etching processes, the method of forming these memory cells 102 is more easily compatible with back end of line (BEOL) process flows relative to previous approaches. Thus, formation of the embedded memory array 101 using these techniques provides greater efficiency in the use of board space, more reliable memory operations, and reduced manufacturing cost.

With reference to FIGS. 5 through 19, cross-sectional views and top down views of some embodiments of an embedded memory device at various stages of manufacture are provided. Although FIGS. 5 through 19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
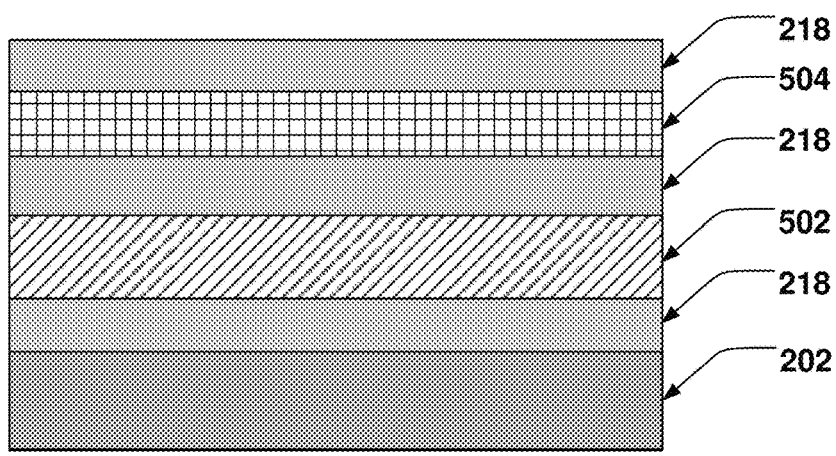
FIGS. 5 through 19B illustrate a series of incremental manufacturing steps as a series of cross-sectional views and top-down views.

FIG. 5 illustrates a cross-sectional view 500 of some embodiments illustrating a series of layers disposed over a substrate 202. The series of layers includes a sacrificial nitride layer 502, a conductive layer 504, and a series of oxide layers 218 separating the substrate 202, the sacrificial nitride layer 502 and the conductive layer 504. The series of layers all extend horizontally over the substrate 202, and the sacrificial nitride layer 502 is formed before the conductive layer 504. The sacrificial nitride layer 502 can be a nitride, such as silicon nitride, or other suitable materials. In some embodiments, the conductive layer 504 may comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials. In some embodiments, the substrate 202 can be a bulk silicon substrate wafer, a semiconductor-on-insulator (SOI) substrate wafer (e.g., silicon on insulator substrate), or another suitable type of wafer. The series of oxide layers 218 can be silicon oxide or other suitable materials. The series of oxide layers 218 and the sacrificial nitride layer 502 may be formed by chemical vapor deposition (CVD) or atomic layer deposition (ALD). The conductive layer 504 may be formed by physical vapor deposition (PVD) or electroplating.

In some embodiments, the series of oxide layers 218 may have a thickness in a range between, for example, approximately 200 angstroms to 800 angstroms, though other ranges of thicknesses are also within the scope of this disclosure. If the thickness of the series of oxide layers 218 is too small (e.g., less than approximately 200 angstroms), there may be current leakage between layers of the resulting semiconductor device. If the thickness is too large (e.g., greater than approximately 800 angstroms), there may be insufficient gate control of the resulting semiconductor memory device due to the resulting distances between the transistor elements.

In some embodiments, the sacrificial nitride layer 502 may have a thickness in a range between, for example, approximately 200 angstroms to 1.5 micrometers, though other ranges of thicknesses are also within the scope of this disclosure. If the thickness of the sacrificial nitride layer 502 is too small (e.g., less than approximately 200 angstroms), the processes used to fill the space occupied by the sacrificial nitride layer 502 in later steps may not fill the space properly (see FIGS. 15 and 16). If the thickness is too large (e.g., greater than approximately 1.5 micrometers), it may be prohibitively time-consuming and costly to remove the sacrificial nitride layer 502 in subsequent steps. A higher thickness may also give the sacrificial nitride layer a higher aspect ratio, leading to more difficulty filling the space left behind in subsequent steps (see FIGS. 15 and 16).

In some embodiments, the conductive layer 504 may have a thickness in a range between, for example, approximately 200 angstroms to 1.5 micrometers, though other ranges of thicknesses are also within the scope of this disclosure. If the thickness of the conductive layer 504 is too small (e.g., less than approximately 200 angstroms), there may be insufficient gate control of the resulting semiconductor memory device due to the small area of the sidewall of the source line SL1 facing the pillar of channel material 204. If the thickness is too large (e.g., greater than approximately 1.5 micrometers), it may be prohibitively time-consuming and costly to form holes in the conductive layer 504 in subsequent steps (see FIGS. 6, 8, and 13).

Figure 6:
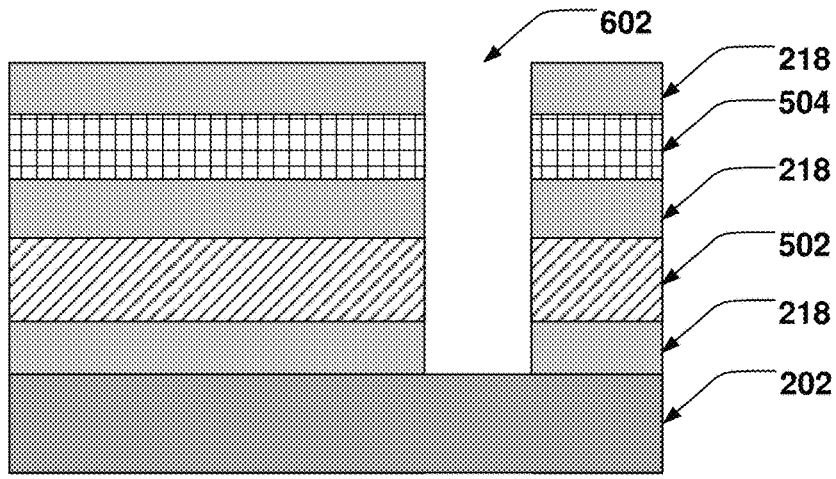

As illustrated in the cross-sectional view 600 of FIG. 6, a plurality of trenches 602 are formed through sacrificial nitride layer 502, the conductive layer 504, and the series of oxide layers 218, down to the substrate 202 in a first direction 207. Each trench of the plurality of trenches 602 extends in a first direction 207 perpendicular to the cross-sectional view. The plurality of trenches 602 may be formed through plasma dry etching or other suitable techniques. In some embodiments, the plurality of trenches may have a width in a range between, for example, 400 angstroms to 2000 angstroms, but other ranges of widths are also within the scope of this disclosure. If the width of the plurality of trenches is too small (e.g., less than approximately 400 angstroms), layers will not form properly in the trenches in subsequent process steps (see FIG. 9). If the width of the plurality of trenches 602 is too large (e.g., more than approximately 2000 angstroms), this would increase the overall dimensions of the semiconductor device unnecessarily.

Figure 7:
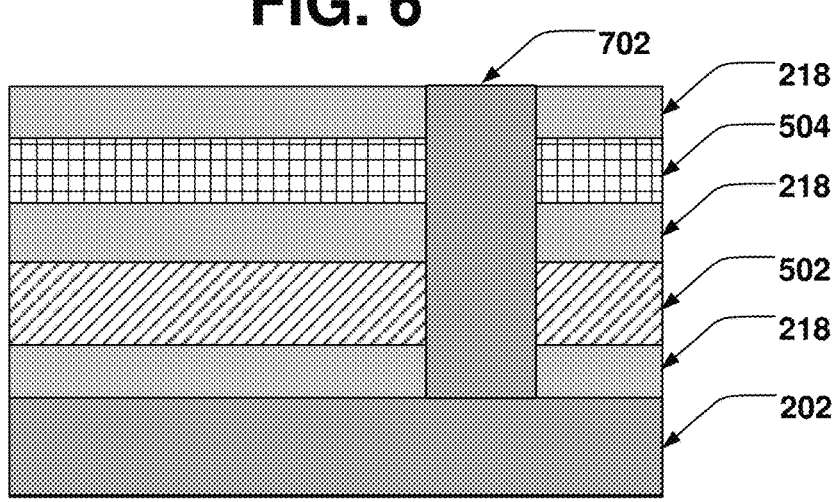

In the cross-sectional view 700 of FIG. 7, an insulating filler 702 is formed in the plurality of trenches 602, filling the opened space. This is done by forming an electrically insulating material on the uppermost oxide layer 218 and in the plurality of trenches 602 by using CVD, ALD, or other suitable techniques, and subsequently removing the electrically insulating material above the uppermost oxide layer 218 using a planarization process (e.g., chemical mechanical polishing (CMP) processing), plasma dry etching, or other suitable processes. The electrically insulating material may comprise silicon oxide, silicon oxide-based materials, or other suitable materials.

Figure 8A:
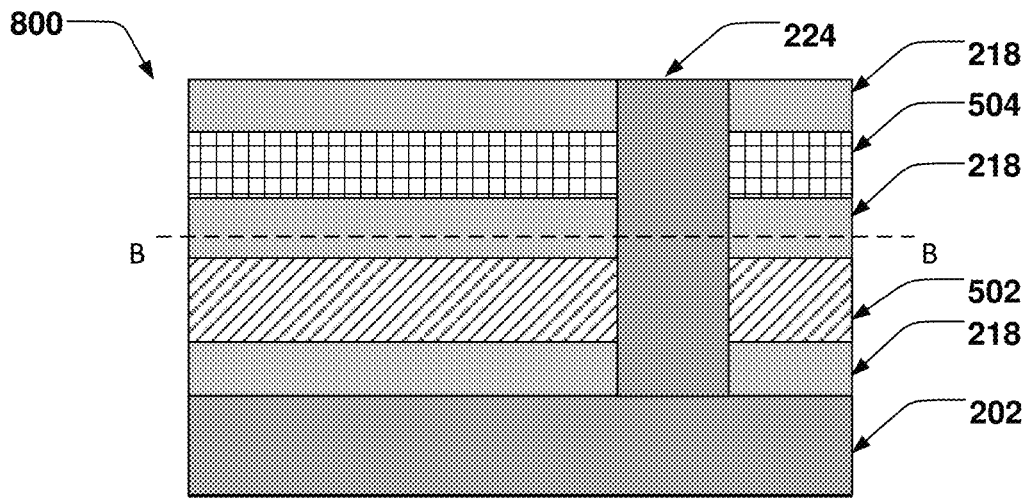
Figure 8B:
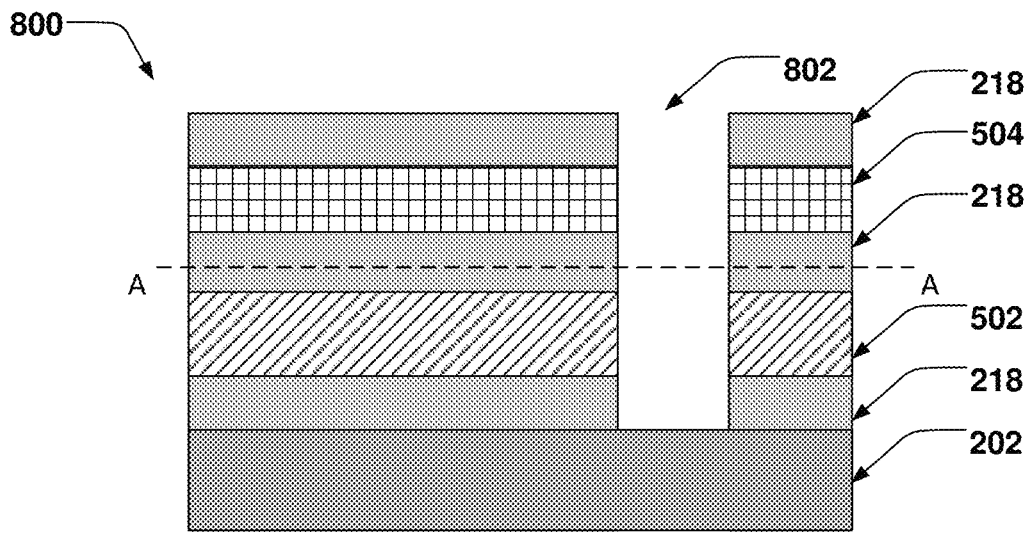
Figure 8C:
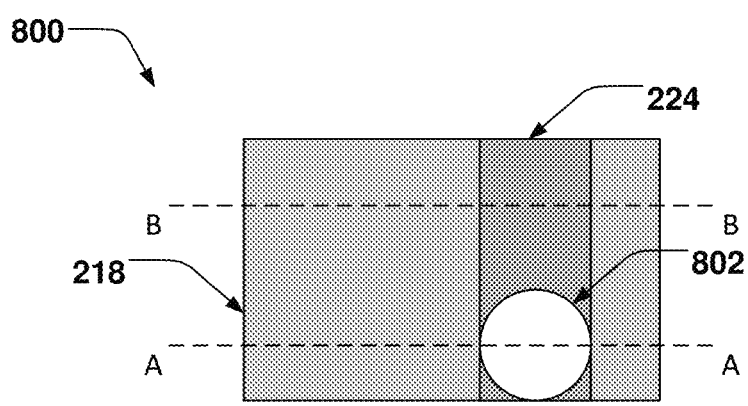

In the cross-sectional and top down views 800 of FIGS. 8A, 8B, and 8C, a plurality of bit line holes 802 are formed in the insulating filler 702, indirectly forming the insulating structures 224. The plurality of bit line holes 802 are substantially circular and extend perpendicular to the substrate 202. In some embodiments, the plurality of bit line holes 802 extend to the substrate 202. In some embodiments, the plurality of bit line holes 802 extend slightly into the substrate 202. The plurality of bit line holes 802 are formed from plasma dry etching or other suitable techniques. In some embodiments, the bit line holes 802 in a first trench of the plurality of trenches 602 share dimensions in the second direction 209 with the bit line holes 802 in a second trench of the plurality of trenches 602 (see FIG. 4A). In some embodiments, the bit line holes 802 in a first trench of the first plurality of trenches 602 are spaced in the third direction 211 from the bit line holes 802 in a second trench of the first plurality of trenches 602 (see FIG. 4B).

In some embodiments, the plurality of bit line holes 802 are evenly distributed along the insulating structures 224 with a minimum distance between two bit line holes 802 of the same insulating structure 224 in a range between, for example, approximately 200 angstroms to 2000 angstroms. If the distance between the bit line holes 802 is too small (e.g., less than approximately 200 angstroms), the two adjacent bit line holes 802 may merge together due to errors in photolithography alignment. If the distance is too large (e.g., greater than approximately 2000 angstroms), this would increase the overall dimensions of the semiconductor device unnecessarily.

Figure 9:
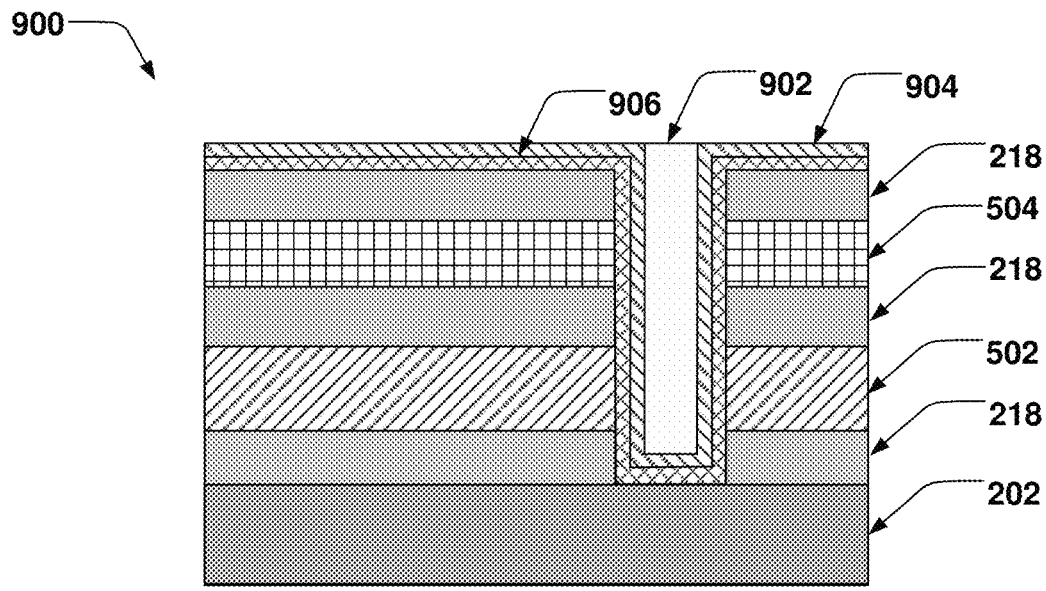

In the cross-sectional view 900 of FIG. 9, a conformal dielectric layer 902, a conformal channel layer 904 and a conformal insulating core 906 are each formed over the top surface of the uppermost oxide layer 218 and in the plurality of bit line holes 802. The conformal dielectric layer 902, the conformal channel layer 904 and the conformal insulating core 906 respectively are formed using one of CVD, ALD, or other suitable techniques. The conformal insulating core 906 above the uppermost sidewall of the conformal channel layer 904 is removed through a planarization (e.g., CMP) process, an etching process, or another suitable process.

In some embodiments, a removal process is performed after forming the conformal dielectric layer 902 and the conformal channel layer 904, but before forming the conformal insulating core 906. This removal process removes a portion of the conformal dielectric layer 902 and the conformal channel layer 904 lining the bottom of the bit line hole 802, while leaving innermost sidewalls of the conformal dielectric layer 902 flush with inner sidewalls of the conformal channel layer 904 (see FIG. 3D). A further removal process applied to the conformal dielectric layer 902 before the formation of the conformal channel layer 904 may be performed in other embodiments (see FIG. 3C).

The conformal dielectric layer 902 may comprise oxide-based materials, nitride-based materials, high-k materials, and/or other suitable materials. For example, in some embodiments the conformal dielectric layer 902 comprises one of hafnium silicon oxide, hafnium oxide ($HfO_2$), zirconium oxide ($ZrO_2$), lanthanum oxide ($La_2O_3$), titanium oxide ($TiO_2$), silicon carbon nitride, silicon oxide, or a combination of multiple of these or other suitable materials. The conformal channel layer 904 may comprise a first material, which is one of undoped polysilicon, lightly doped polysilicon (in some embodiments with a concentration of 1E15/cm$^3$ to 1E17/cm$^3$, though other ranges of values are also within the scope of this disclosure), IGZO, or other suitable materials. The conformal insulating core 906 comprises silicon oxide, silicon oxide-based materials, or other suitable materials.

In some embodiments, the conformal dielectric layer 902 may have a thickness in a range between, for example, approximately 20 angstroms to 100 angstroms, though other ranges of thicknesses are also within the scope of this disclosure. If the thickness of the conformal dielectric layer 902 is too small (e.g., less than approximately 20 angstroms), there may be current leakage through the pair of memory devices. If the thickness is too large (e.g., greater than approximately 100 angstroms), there may be insufficient gate control of the resulting semiconductor memory device due to the resulting distances between the transistor elements.

In some embodiments, the conformal channel layer 904 may have a thickness in a range between, for example, approximately 60 angstroms to 300 angstroms, though other ranges of thicknesses are also within the scope of this disclosure. If the thickness of the conformal dielectric layer 902 is too small (e.g., less than approximately 20 angstroms), the conformal channel layer may have a high resistance, lowering the performance of the pair of memory cells. If the thickness is too large (e.g., greater than approximately 300 angstroms), there may be insufficient gate control for the resulting pair of memory devices due to the proximity and lack of isolation between the first memory device 102$_{1,1}$ and the second memory device 102$_{2,1}$ sharing the pillar of channel material 204.

Figure 10:
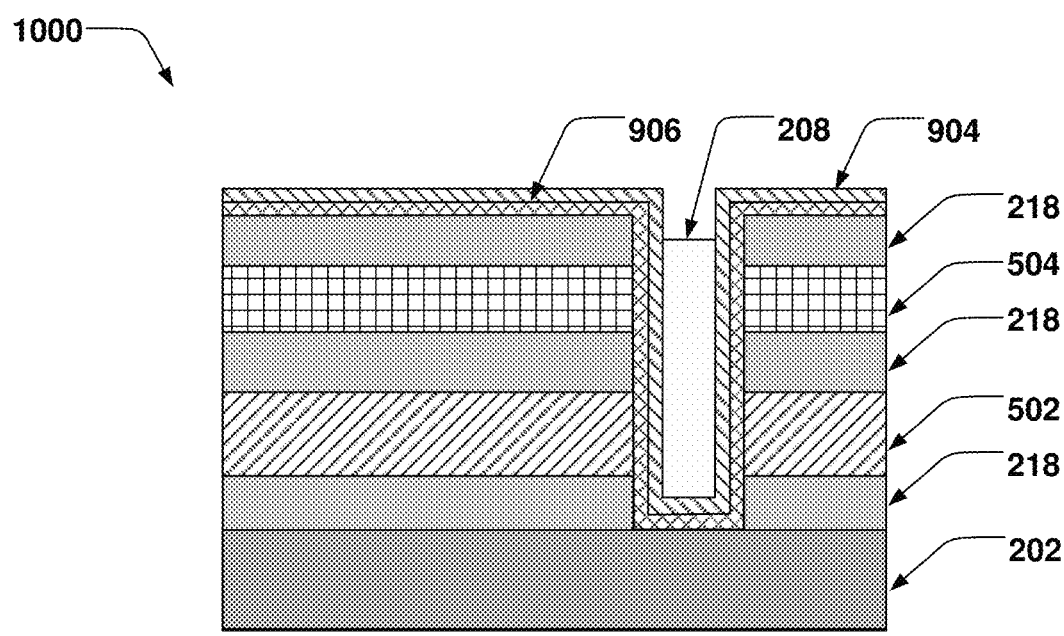

In the cross-sectional view 1000 of FIG. 10, the conformal insulating core 906 is etched back to form the insulating core 208. This step leaves a recess above the insulating core 208 between the inner sidewalls of the conformal channel layer 904. This recess extends past the uppermost surface of the uppermost oxide layer 218, but not past the uppermost surface of the conductive layer 504. The conformal insulating core 906 is patterned using dry etching or other suitable techniques.

Figure 11:
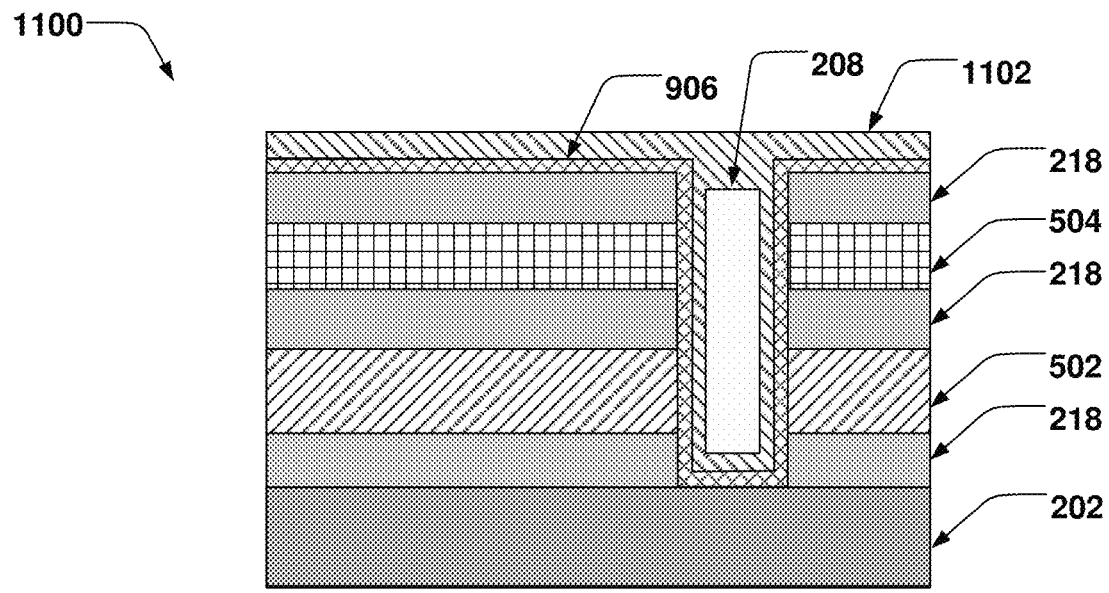

In the cross-sectional view 1100 of FIG. 11, the recess above the insulating core 208 is filled with the first material 1102, which is the same material as the conformal channel layer 904. This forms another layer of the conformal channel layer 904 over the uppermost surface of the insulating core 208, extending above the uppermost surface of the uppermost oxide layer 218.

Figure 12:
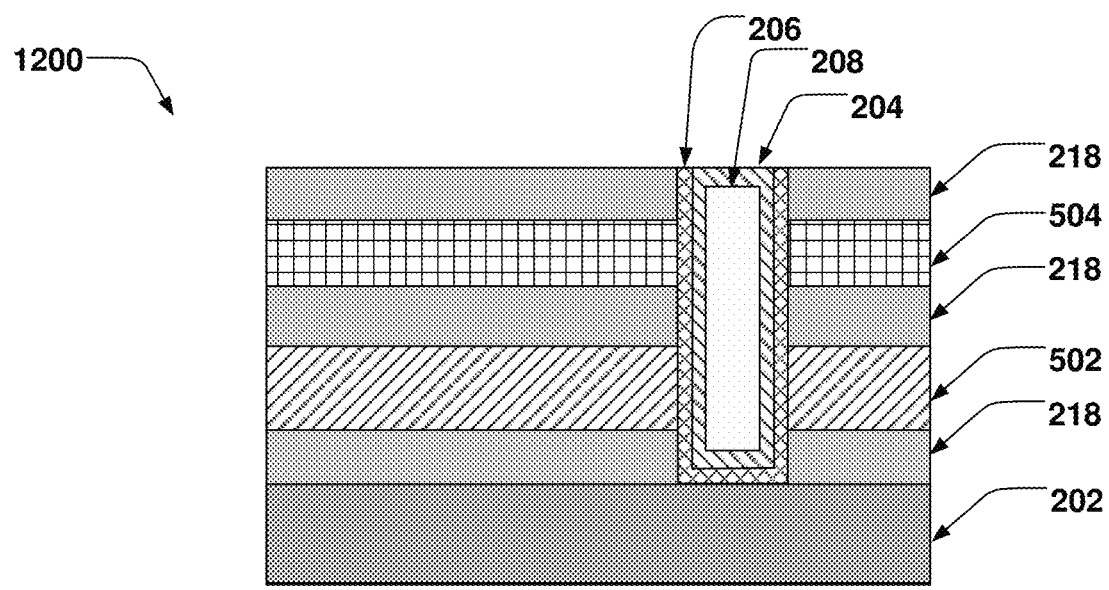

In the cross-sectional view 1200 of FIG. 12, a removal process is used to remove the segments of the conformal dielectric layer 902 and the conformal channel layer 904 that extend above the uppermost oxide layer 218. This process patterns the conformal dielectric layer 902 and the conformal channel layer 904, forming the dielectric layer 206 and the pillar of channel material 204 within the plurality of bit line holes 802. The removal process may be one of a planarization (e.g., CMP) process, or other suitable processes.

Figure 13:
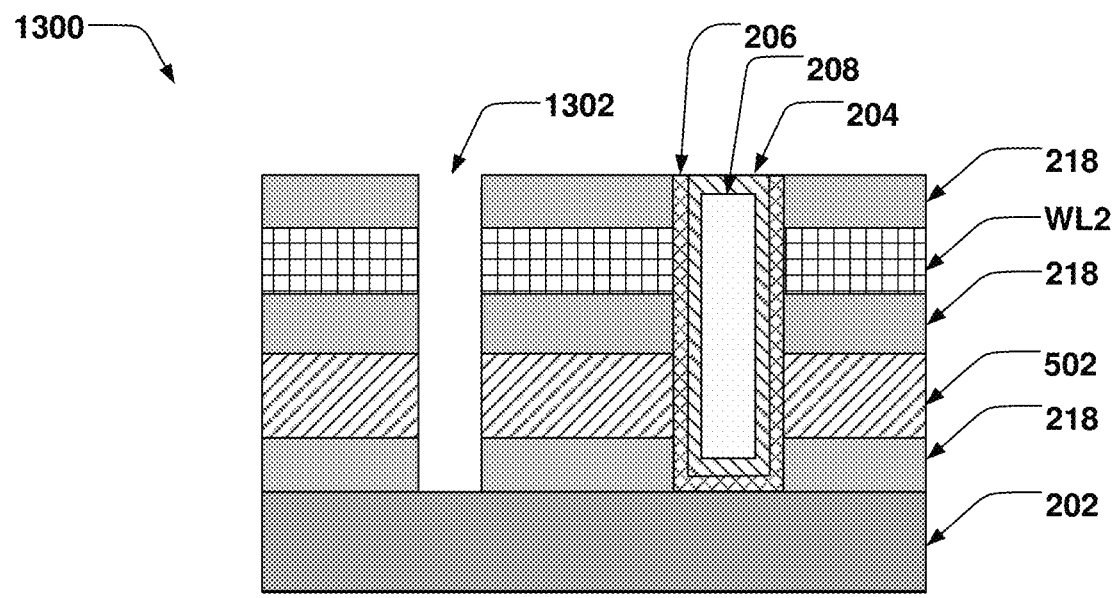

In the cross-sectional view 1300 of FIG. 13, a second plurality of trenches 1302 is formed through the sacrificial nitride layer 502, the conductive layer 504, and the series of oxide layers 218. Each trench of the second plurality of trenches 1302 extends in a first direction 207 perpendicular to the cross-sectional view substantially parallel with the insulating structures 224. The forming of the second plurality of trenches 1302 divides the conductive layer 504 into word lines WL1, WL2, etc. The second plurality of trenches 1302 is formed using plasma dry etching or other suitable techniques. In some embodiments, the second plurality of trenches 1302 extend down to the substrate 202. In some embodiments, the second plurality of trenches 1302 extend slightly into the substrate 202.

In some embodiments the second plurality of trenches 1302 may have a width in a range between, for example, 50 nanometers to 5 micrometers, but other ranges of widths are also within the scope of this disclosure. If the width of the second plurality of trenches 1302 is too small (e.g., less than approximately 50 nanometers), layers will not form properly in the trenches in subsequent process steps (see FIGS. 15-18). If the width of the second plurality of trenches 1302 is too large (e.g., more than approximately 5 micrometers), this would increase the overall dimensions of the semiconductor device unnecessarily.

In some embodiments the distance between the second plurality of trenches 1302 and the insulating structures 224 adjacent to them may have a distance in a range between, for example, 300 angstroms to 800 angstroms, but other ranges of widths are also within the scope of this disclosure. If the width of the second plurality of trenches 1302 is too small (e.g., less than approximately 300 angstroms), the resulting memory devices 102 may have a high resistance due to a small source line SL1, SL2 volume. If the width of the second plurality of trenches 1302 is too large (e.g., more than approximately 800 angstroms), this would increase the overall dimensions of the semiconductor device unnecessarily.

Figure 14:
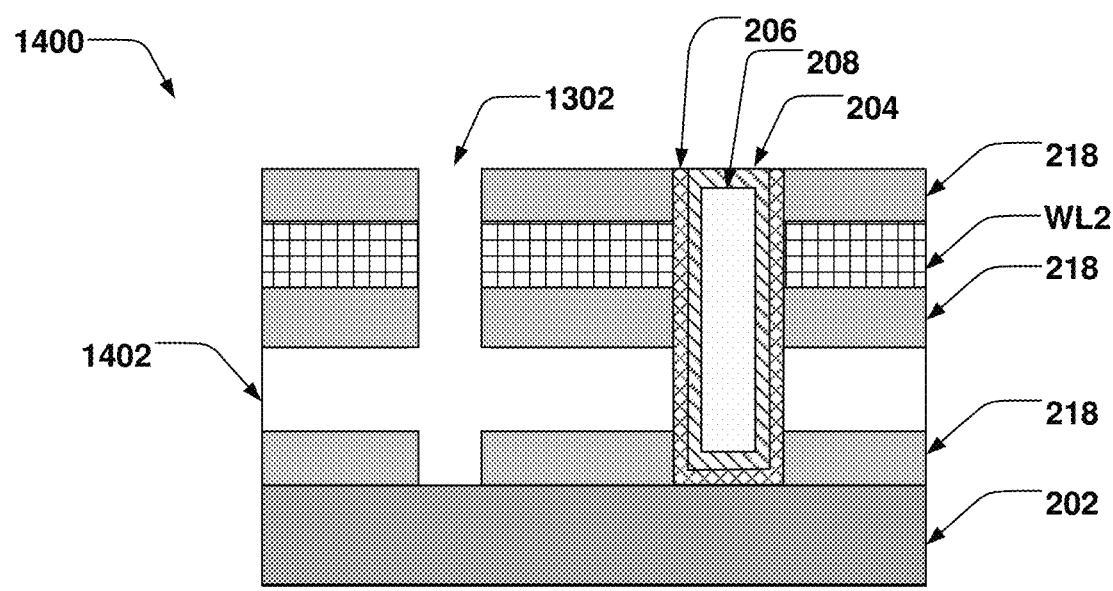

In the cross-sectional view 1400 of FIG. 14, the sacrificial nitride layer 502 is removed using phosphoric acid or other suitable techniques, leaving a series of cavities 1402 between the second plurality of trenches 1302 and the insulating structures 224.

Figure 15:
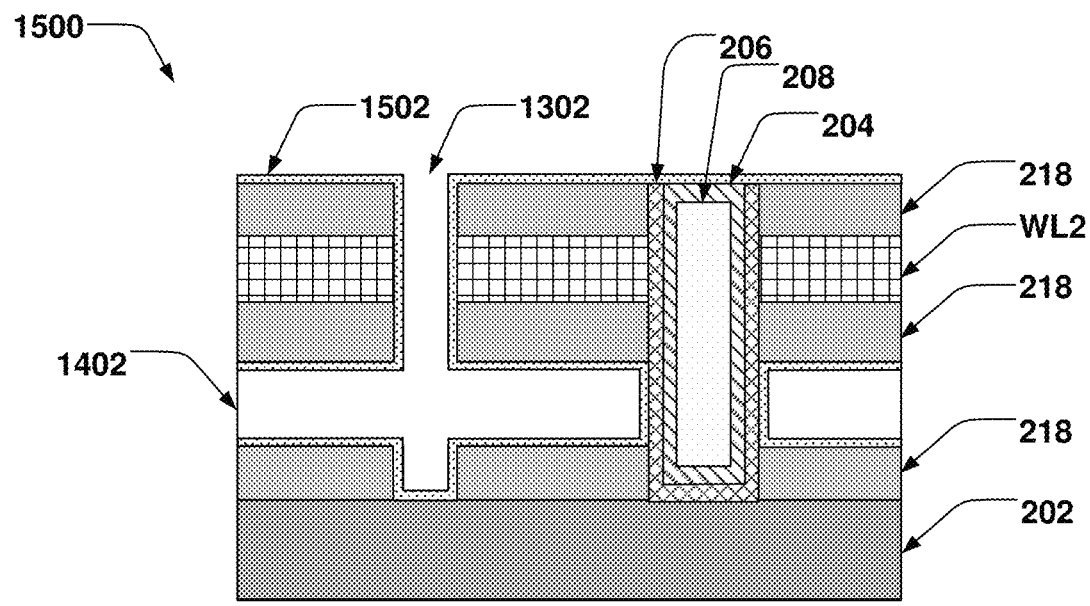

In the cross-sectional view 1500 of FIG. 15, a memory layer 1502 is formed in the series of cavities 1402, in the second plurality of trenches 1302, and along the uppermost surface of the uppermost oxide layer 218. The memory layer 1502 conforms to the inner sidewalls of the series of cavities 1402 and the second plurality of trenches 1302. The memory layer 1502 is formed using ALD, CVD, or other suitable techniques. In some embodiments, the memory layer 1502 may have a thickness in a range between, for example, approximately 20 angstroms to 200 angstroms, though other ranges of thicknesses are also within the scope of this disclosure. If the thickness of the memory layer 1502 is too small (e.g., less than approximately 20 angstroms), there may be current leakage through the embedded memory devices and a lower breakdown threshold. If the thickness is too large (e.g., greater than approximately 200 angstroms), a large voltage may be necessary to operate the resulting embedded memory device.

Figure 16:
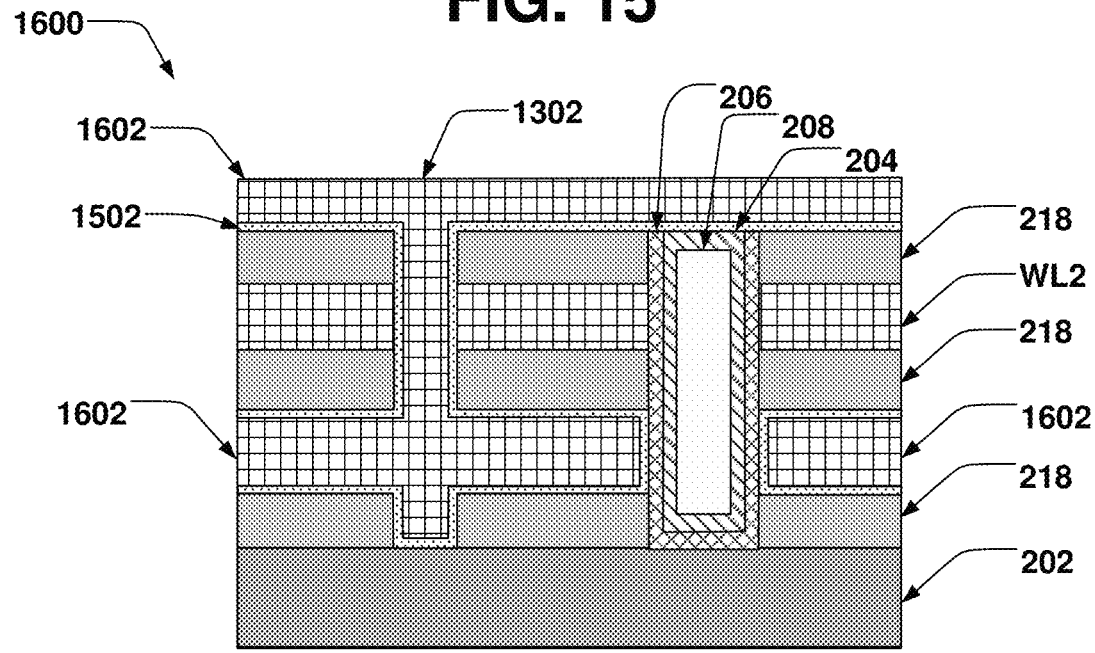

In the cross-sectional view 1600 of FIG. 16, a gate layer 1602 is formed in the series of cavities 1402, in the second plurality of trenches 1302, and along the uppermost surface of the uppermost oxide layer 218. The gate layer 1602 fills the remaining space in the series of cavities 1402 and lines the inner sidewalls of the memory layer 1502. The gate layer 1602 is formed using ALD, CVD, or other suitable techniques. The gate layer 1602 comprises tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials.

Figure 17:
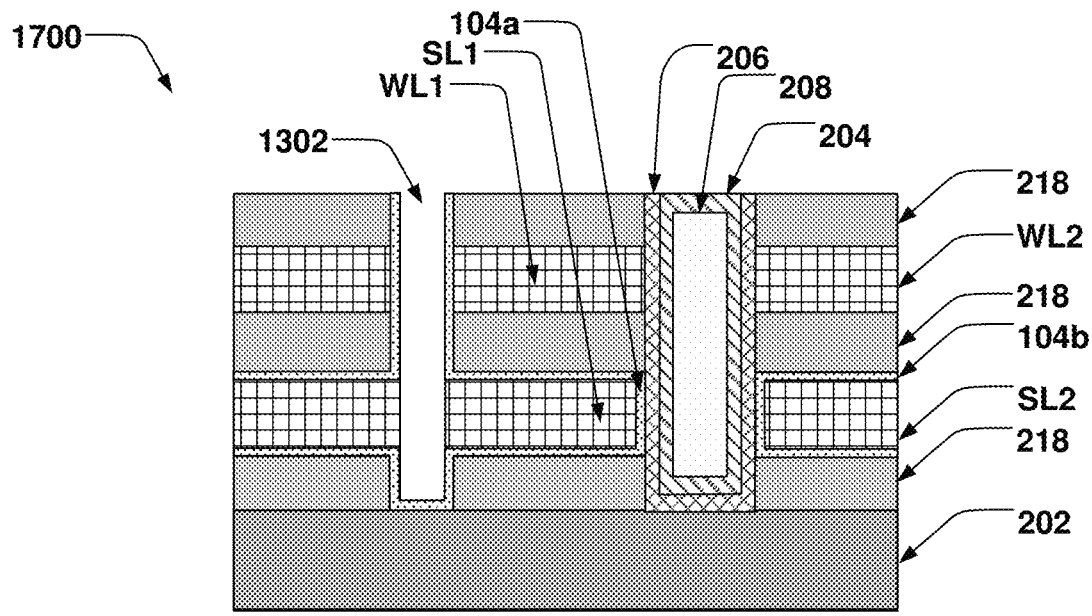

In the cross-sectional view 1700 of FIG. 17, parts of the gate layer 1602 are removed using plasma dry etching or other suitable techniques. The parts of the gate layer 1602 that are removed are the portions that are overlying an uppermost oxide layer and are within the second plurality of trenches. The remaining parts of the gate layer 1602 in the series of cavities 1402 form separate source lines SL1, SL2, etc. In some embodiments, parts of the memory layer 1502 above the uppermost oxide layer 218 are also removed along with the parts of the gate layer 1602. In some embodiments, the memory layer 1502 on the sidewall and the bottom surface of the second plurality of trenches 1302 is partially etched. The properties of the resulting embedded memory device will not be affected by etching of the memory layer 1502 on the sidewall of the trench.

Figure 18:
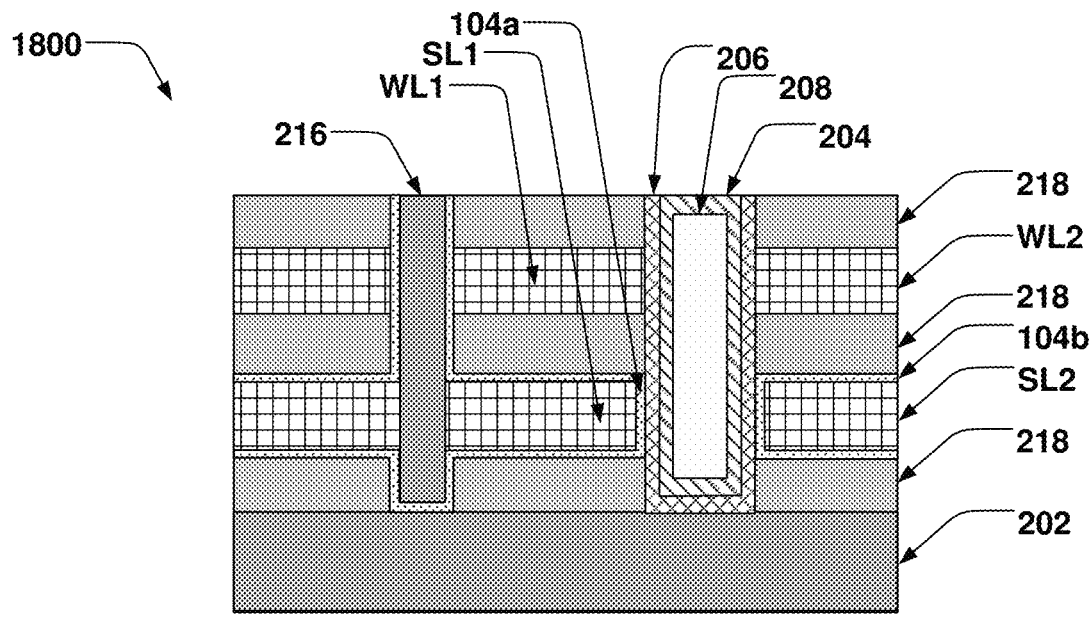

In the cross-sectional view 1800 of FIG. 18, insulating segments 216 are formed in the second plurality of trenches 1302. The insulating segments 216 are formed by using ALD, CVD, or other suitable techniques to form an insulating material over the uppermost oxide layer 218 and in the second plurality of trenches 1302, and then using a CMP process or other suitable techniques to remove the insulating material above the uppermost oxide layer 218. The insulating segments 216 may comprise silicon oxide, silicon oxide-based materials, or other suitable materials. In some embodiments, parts of the memory layer 1502 above the uppermost oxide layer 218 are removed after the insulating segments are formed.

Figure 19A:
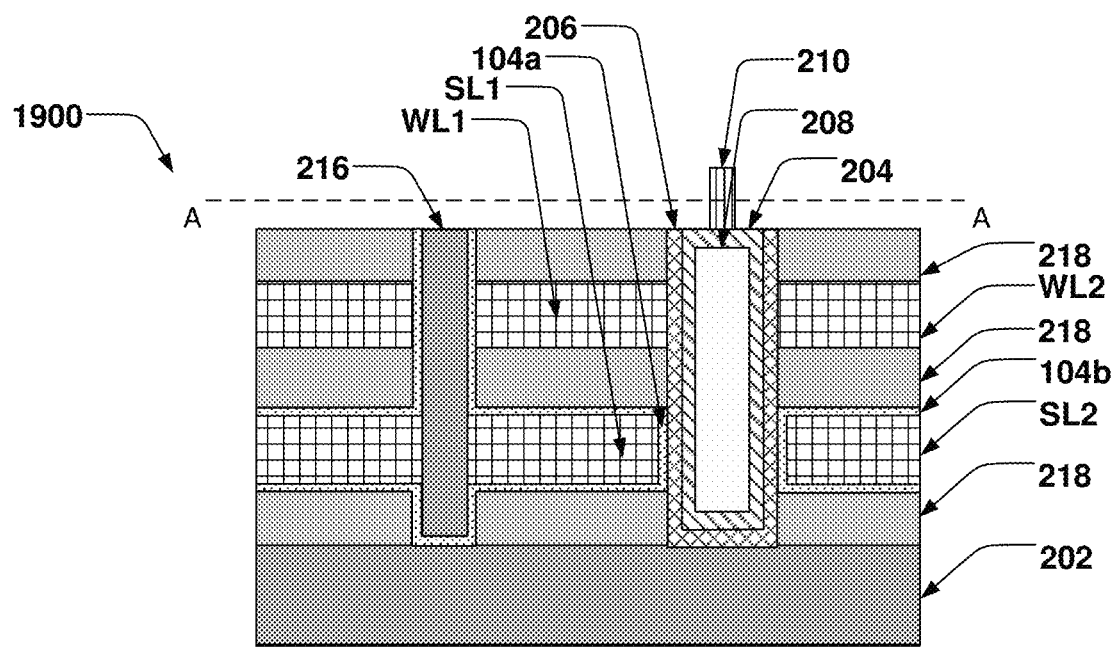
Figure 19B:
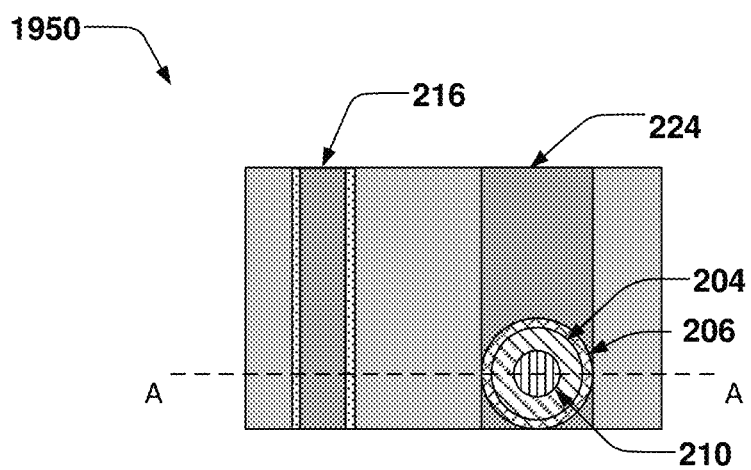

In the cross-sectional view 1900 and the top down view 1950 of FIG. 19, bit line contacts 210 are formed on the pillars of channel material 204. In some embodiments, the bit line contacts 210 comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials. In some embodiments, the bit line contact 210 is cylindrical with a radius less than that of the insulating core 208, and are approximately centered on the pillars of channel material 204.

After the bit line contacts are formed, the bit lines BL1, BL2, etc. may be formed over the bit line contacts 210. The bit lines BL1, BL2, etc. extend in a second direction 209, which is perpendicular to the first direction 207 that the insulating segments 216 and the insulating structures 224 extend in.

Figure 20:
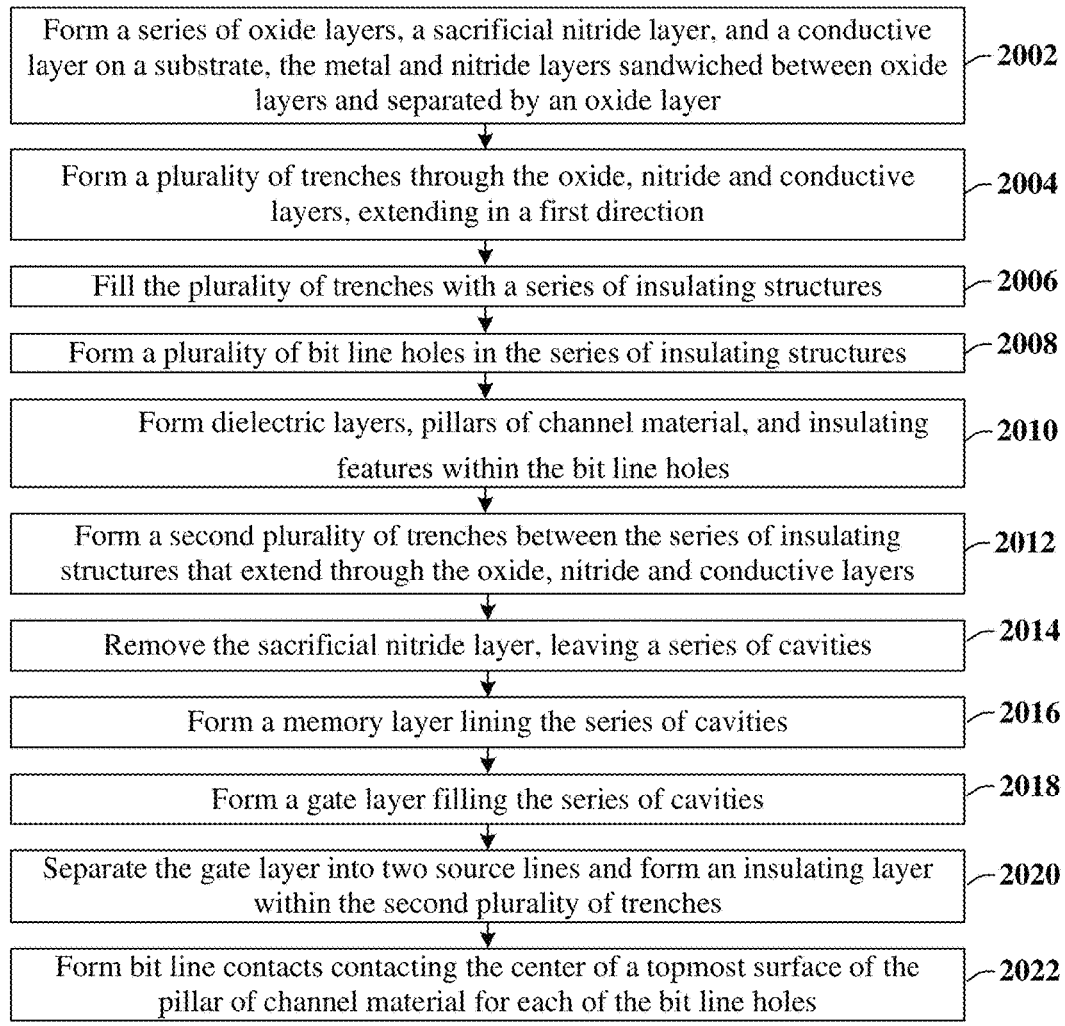
FIG. 20 illustrates a methodology in flowchart format that illustrates some embodiments of the present concept.

FIG. 20 illustrates a methodology 2000 of forming a memory array in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002 a nitride layer, a conductive layer, and a series of oxide layers are formed over a substrate, wherein the substrate, the nitride layer, and the conductive layer are separated by the series of oxide layers. FIG. 5 illustrates a cross-sectional view 500 of some embodiments corresponding to act 2002.

At act 2004, a first plurality of trenches are formed that extend through the nitride layer, the conductive layer, and the series of oxide layers along a first direction 207, the first plurality of trenches being separated in a second direction 209 perpendicular to the first direction 207. FIG. 6 illustrates a cross-sectional view 600 of some embodiments corresponding to act 2004.

At act 2006, the first plurality of trenches are filled with a series of insulating structures. FIG. 7 illustrates a cross-sectional view 700 of some embodiments corresponding to act 2006.

At act 2008, a plurality of bit line holes are formed in the series of insulating structures. FIGS. 8A, 8B, and 8C illustrate cross-sectional views and top down views 800 of some embodiments corresponding to act 2008.

At act 2010, forming a dielectric layer, pillars of channel material, and an insulating core within the bit line holes. FIGS. 9-12 illustrates a series of cross-sectional views 900-1200 of some embodiments corresponding to act 2010.

At act 2012, a second plurality of trenches are formed between the series of insulating structures extending through the series of oxide layers. FIG. 13 illustrates a cross-sectional view 1300 of some embodiments corresponding to act 2012.

At act 2014, the nitride layer is removed, leaving a series of cavities. FIG. 14 illustrates a cross-sectional view 1400 of some embodiments corresponding to act 2014.

At act 2016, a memory layer is formed lining the series of cavities. FIG. 15 illustrates a cross-sectional view 1500 of some embodiments corresponding to act 2016.

At act 2018, a gate layer is formed, filling the series of cavities after the memory layer has been formed. FIG. 16 illustrates a cross-sectional view 1600 of some embodiments corresponding to act 2018.

At act 2020, the gate layer is separated into two halves and an insulating segment is formed between the series of cavities. FIGS. 17-18 illustrates a series of cross-sectional views 1700-1800 of some embodiments corresponding to act 2020.

At act 2022, bit line contacts are formed, contacting a center of a topmost surface of the pillar of channel material for each of the bit line holes. FIG. 19 illustrates a cross-sectional view 1900 of some embodiments corresponding to act 2022.

Some embodiments relate to a semiconductor memory device. The semiconductor memory device includes a substrate and a pillar of channel material. The pillar of channel material extends in a first direction substantially perpendicular to an upper surface of the substrate. A bit line is disposed over the pillar of channel material and is coupled to the pillar of channel material, and extends in a second direction that is parallel to the upper surface of the substrate and is perpendicular to the first direction. A dielectric layer is laterally surrounding sidewalls of the pillar of channel material. First and second word lines are disposed at a first height on opposite sides of the pillar of channel material and are extending in a third direction over the substrate. The third direction is perpendicular to the second direction. The dielectric layer separates the first and second word lines from the pillar of channel material. First and second source lines extend in the third direction over the substrate, and are respectively disposed directly beneath the first and second word lines. First and second variable resistance memory layers are disposed between the first and second source lines and an outer sidewall of the dielectric layer. The first and second variable resistance memory layers are laterally surrounding the sidewalls of the pillar of channel material.

Some embodiments relate to a semiconductor memory device. The semiconductor memory device includes a substrate and a first column of pillars of channel material. Each pillar of channel material of the first column of pillars of channel material extends outward from the substrate in a first direction, and has a width equal to each other pillar of channel material of the first column of pillars of channel material measured in a second direction perpendicular to the first direction. Each pillar of channel material of the first column of pillars of channel material also is spaced from each other by insulating structures in a third direction that is perpendicular to the first direction and the second direction. First and second memory layers extend in the third direction on opposite side of the first column of pillars of channel material. The first and second memory layers are spaced from one another in the second direction. First and second source lines are surrounded by the first and second memory layers in the first direction and the second direction. The first and second source lines are directly between the top surfaces and bottom surfaces of the first and second memory layers. First and second word lines extend in the third direction and are directly above the first and second memory layers. The first and second word lines are separated from the first and second memory layers by an oxide layer. The semiconductor memory device includes a second column of pillars of channel material. Each pillar of channel material of the second column extends outward from the substrate in the first direction, is separated from the first column of pillars of channel material in the second direction, and is spaced from the first column of pillars of channel material by an insulative segment.

Some embodiments relate to a method of making a semiconductor memory device. The method involves forming a nitride layer, a conductive layer, and a series of oxide layers over a substrate, wherein the substrate, the nitride layer, and the conductive layers are separated by a series of oxide layers. It also involves forming a first plurality of trenches that extend through the nitride layer, the conductive layer, and the series of oxide layers along a first direction. The first plurality of trenches are separated from one another in a second direction that is perpendicular to the first direction. It also involves filling the first plurality of trenches with a series of insulating structures. A plurality of bit line holes are formed in the series of insulating structures. A dielectric layer, a channel layer, and an insulating core are each formed within the bit line holes. A second plurality of trenches are formed between the series of insulating structures and extend through the series of oxide layers. The nitride layer is removed, which leaves behind a series of cavities. The series of cavities are lined with a memory layer. The series of cavities are then filled with a gate layer. The gate layer is separated into two halves, and an insulating layer is formed between the series of cavities. Bit line contacts are formed on the center of a topmost surface of the channel layer over each of the bit line holes.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor memory device, comprising:
   forming a nitride layer, a conductive layer, and a series of oxide layers over a substrate, wherein the substrate, the nitride layer, and the conductive layer are separated by the series of oxide layers;
   forming a first plurality of trenches extending through the nitride layer, the conductive layer, and the series of oxide layers along a first direction, the first plurality of trenches being separated in a second direction perpendicular to the first direction;
   filling the first plurality of trenches with a series of insulating structures;
   forming a plurality of bit line holes in the series of insulating structures;
   forming a dielectric layer, pillars of channel material, and an insulating core within the bit line holes;
   forming a second plurality of trenches between the series of insulating structures extending through the series of oxide layers;
   removing the nitride layer, leaving a series of cavities;
   forming a memory layer lining the series of cavities;
   forming a gate layer filling the series of cavities after the memory layer has been formed;
   separating the gate layer into two halves and forming an insulating segment between the series of cavities; and
   forming bit line contacts contacting a center of a topmost surface of the pillar of channel material for each of the bit line holes.

2. The method of claim 1, wherein forming the dielectric layer, the pillars of channel material, and the insulating core within the bit line holes further comprises:
   forming a conformal dielectric layer in the plurality of bit line holes;
   forming a conformal channel layer over the conformal dielectric layer;
   etching the conformal channel layer and the conformal dielectric layer such that the substrate is exposed and inner sidewalls of the conformal channel layer are flush with innermost sidewalls of the conformal dielectric layer;
   forming an insulating filler within the plurality of bit line holes;
   forming a recess in the insulating filler, leaving the insulating core;
   filling the recess with a first material, wherein the conformal channel layer comprises the first material; and
   removing segments of the conformal dielectric layer and the conformal channel layer that extend above an uppermost oxide layer, leaving the dielectric layer and the pillars of channel material within the plurality of bit line holes.

3. The method of claim 1, wherein the nitride layer is formed before the conductive layer.

4. The method of claim 1, further comprising:
removing the gate layer overlying an uppermost oxide layer and from within the second plurality of trenches before the insulating segment is formed; and
removing the memory layer overlying the uppermost oxide layer after the insulating segment is formed.

5. The method of claim 1, wherein the bit line holes in a first trench of the first plurality of trenches and the bit line holes in a second trench of the first plurality of trenches are arranged in a plurality of rows extending in the second direction and a plurality of columns extending in a third direction.

6. The method of claim 1, wherein the bit line holes in a first trench of the first plurality of trenches are spaced in a third direction perpendicular to the second direction from the bit line holes in a second trench of the first plurality of trenches and are arranged in a plurality of rows with bit line holes in a third trench of the first plurality of trenches, the rows extending in the second direction.

7. A method of making a semiconductor memory device, comprising:
consecutively depositing a first dielectric layer, a sacrificial layer, a second dielectric layer, a first conductive layer, and a third dielectric layer over a substrate;
etching a first trench through the third dielectric layer, the first conductive layer, the second dielectric layer, the sacrificial layer, and the first dielectric layer, the first trench having a length extending in a first direction and separating segments of the first conductive layer in a second direction perpendicular to the first direction;
forming an insulative fill in the first trench;
forming a plurality of openings in the insulative fill comprising a first opening, wherein the plurality of openings extend from a top surface of the third dielectric layer to a bottom surface of the first dielectric layer;
forming a transistor dielectric in the first opening and lining inner sidewalls of the first opening;
forming a channel layer in the first opening and lining inner sidewalls of the transistor dielectric;
forming an insulating core in the first opening, filling the first opening;
forming a second trench spaced from the insulative fill in the second direction;
removing the sacrificial layer, leaving a cavity extending to the insulative fill and exposing the transistor dielectric within the cavity;
forming a memory layer lining the cavity and extending to the transistor dielectric; and
forming a second conductive layer filling the cavity after the memory layer has been formed.

8. The method of claim 7, wherein after the second trench is formed, the sacrificial layer extends from the second trench to the insulative fill in the second direction.

9. The method of claim 7, further comprising:
capping the insulating core with a channel material, wherein the channel layer comprises the channel material;
forming a bit line contact over the insulating core and extending into the channel material; and
forming a bit line over and electrically coupled to the bit line contact.

10. The method of claim 7, wherein after forming the memory layer, the transistor dielectric extends from the memory layer to the first conductive layer.

11. The method of claim 7, wherein the second conductive layer fills the cavity and the second trench after it is formed, and further comprising removing a portion of the second conductive layer in the second trench after the second conductive layer is formed.

12. The method of claim 11, wherein removing the portion of the second conductive layer exposes an upper surface of the memory layer that is level with the first dielectric layer.

13. The method of claim 7, wherein after forming the transistor dielectric, the transistor dielectric extends across a bottom of the first opening.

14. The method of claim 13, wherein after forming the channel layer, the transistor dielectric extends directly beneath the channel layer.

15. A method of making a semiconductor memory device, comprising:
depositing a sacrificial layer, an insulative layer, and a first conductive layer over a substrate, wherein the sacrificial layer and the first conductive layer are separated by the insulative layer;
forming a first opening that extends from a top surface of the first conductive layer to a bottom surface of the sacrificial layer;
forming a dielectric layer in the first opening and extending along sidewalls of the first conductive layer and the sacrificial layer;
forming a channel layer in the first opening and lining inner sidewalls of the dielectric layer;
removing the sacrificial layer, leaving a cavity between the insulative layer and the substrate;
lining the cavity with a memory layer having a sidewall extending along an outer sidewall of the dielectric layer; and
filling the cavity with a second conductive layer, lining a second sidewall and inner surfaces of the memory layer.

16. The method of claim 15, further comprising exposing the sacrificial layer by etching a second opening through the first conductive layer, the insulative layer, and the sacrificial layer.

17. The method of claim 15, further comprising:
etching a first trench through the first conductive layer, the insulative layer, and the sacrificial layer, thereby separating the first conductive layer into a first portion on a first side of the first trench and a second portion on a second side of the first trench; and
filling the first trench with an insulative fill, wherein the first opening is formed within the insulative fill, and wherein the dielectric layer has a sidewall extending to the first portion of the first conductive layer and the second portion of the insulative layer.

18. The method of claim 15, further comprising removing a middle portion of the second conductive layer level with the cavity, resulting in a first portion of the second conductive layer extending into the cavity and a second portion of the second conductive layer separated from the first portion and extending into the cavity.

19. The method of claim 15, wherein the first opening has a circular profile when viewed from a top-down perspective.

20. The method of claim 15, further comprising forming a bit line over and electrically coupled to the channel layer after forming the second conductive layer, wherein the first conductive layer is vertically between the second conductive layer and the bit line.

* * * * *